(12) United States Patent
Lee et al.

(10) Patent No.: US 9,258,879 B2
(45) Date of Patent: Feb. 9, 2016

(54) HEAT RADIATING SUBSTRATE AND METHOD OF MANUFACTURING THE SAME

(71) Applicant: SAMSUNG ELECTRO-MECHANICS CO., LTD., Suwon (KR)

(72) Inventors: Young Ki Lee, Suwon (KR); Bum Seok Suh, Suwon (KR); Chang Seob Hong, Suwon (KR); Joon Seok Chae, Suwon (KR); Kwang Soo Kim, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/961,398

(22) Filed: Aug. 7, 2013

(65) Prior Publication Data

US 2014/0110156 A1    Apr. 24, 2014

(30) Foreign Application Priority Data

Oct. 22, 2012   (KR) .................... 10-2012-0117418

(51) Int. Cl.
| | |
|---|---|
| *H05K 1/00* | (2006.01) |
| *H05K 1/02* | (2006.01) |
| *H05K 1/05* | (2006.01) |
| *H01L 25/16* | (2006.01) |
| *H01L 33/64* | (2010.01) |

(52) U.S. Cl.
CPC ................ *H05K 1/0201* (2013.01); *H05K 1/05* (2013.01); *H01L 25/167* (2013.01); *H01L 33/642* (2013.01); *H01L 2224/48091* (2013.01); *H01L 2224/73265* (2013.01); *H05K 2201/09845* (2013.01); *H05K 2201/09972* (2013.01); *H05K 2203/0323* (2013.01); *Y10T 29/49155* (2015.01)

(58) Field of Classification Search
CPC ... H05K 7/20; H05K 1/0201; H05K 7/20154; H05K 7/2039; H01L 25/167; H01L 33/642; H01L 25/115; H01L 25/16; H01L 33/641; H01L 33/644; H01L 33/647; H01L 23/34
USPC ......................... 174/252, 250, 255, 256, 260
See application file for complete search history.

(56) References Cited

U.S. PATENT DOCUMENTS

| | | | | |
|---|---|---|---|---|
| 5,616,888 | A * | 4/1997 | McLaughlin et al. | ........ 174/260 |
| 6,432,750 | B2 | 8/2002 | Jeon | |
| 2009/0244848 | A1* | 10/2009 | Lim et al. | ...................... 361/709 |

FOREIGN PATENT DOCUMENTS

| | | |
|---|---|---|
| KR | 10-2011-0082895 | 7/2011 |
| KR | 10-2012-0115067 | 10/2012 |

OTHER PUBLICATIONS

Office action dated Dec. 4, 2013 from corresponding Korean Patent Application No. 10-2012-0117418 and its English summary provided by the clients.

* cited by examiner

*Primary Examiner* — Tremesha S Willis
(74) *Attorney, Agent, or Firm* — Ladas & Parry, LLP

(57) ABSTRACT

Disclosed herein is a heat radiating substrate including: a heat radiating plate having a step formed so that one side and the other side thereof have thicknesses different from each other; a conductor pattern layer formed over the heat radiating plate and including a mounting pad on which a control device and a power device are mounted and a circuit pattern; and an insulating layer formed between the heat radiating plate and the conductor pattern layer.

12 Claims, 4 Drawing Sheets

HEAT RADIATING SUBSTRATE AND METHOD OF MANUFACTURING THE SAME

CROSS REFERENCE TO RELATED APPLICATION

This application claims the benefit of Korean Patent Application No. 10-2012-0117418, filed on Oct. 22, 2012, entitled "heat radiating substrate and a method of manufacturing the same", which is hereby incorporated by reference in its entirety into this application.

BACKGROUND OF THE INVENTION

1. Technical Field

The present invention relates to a heat radiating substrate and a method of manufacturing the same.

2. Description of the Related Art

Recently, in accordance with the development of an electronic industry, the demand for improvement in a function of an electronic component has rapidly increased. Further, in accordance with slimness and lightness of the electronic components, in connection with a circuit board on which the electronic components are mounted, a large number of electronic products should be integrated in a small area of the circuit board.

Meanwhile, high heat generating devices generating high heat, such as a power device, a light emitting diode (LED), and the like, are mounted on the circuit board. In the case in which the heat generated by the high heat generating devices are not rapidly radiated, a temperature of the circuit board is raised to cause an operation of the heat generating device to be disabled and cause a malfunction of the heat generating device. Therefore, research into a heat radiating substrate, which is a circuit board with improved heat radiation characteristics, has been conducted.

A heat radiating substrate according to the prior art has a structure in which both of a power device generating high heat and a control device vulnerable to heat are mounted on a heat radiating plate (U.S. Pat. No. 6,432,750). In addition, the heat radiating plate is made of a material having excellent heat conductivity in order to radiate the heat of the power device. In this case, since the power device and the control device are mounted on the same heat radiating plate, the heat generated from the power device may be conducted to the control device through the heat radiating plate. Therefore, the control device is affected by the heat generated from the power device, such that it may malfunction.

SUMMARY OF THE INVENTION

The present invention has been made in an effort to provide a heat radiating substrate capable of preventing a defect of a control device by decreasing heat generated from a power device and conducted to the control device, and a method of manufacturing the same.

Further, the present invention has been made in an effort to provide a heat radiating substrate capable of improving reliability of a package at the time of packaging devices by decreasing heat generated from a power device and conducted to a control device, and a method of manufacturing the same.

According to a preferred embodiment of the present invention, there is provided a heat radiating substrate including: a heat radiating plate having a step formed so that one side and the other side thereof have thicknesses different from each other; a conductor pattern layer formed over the heat radiating plate and including a mounting pad on which a control device and a power device are mounted and a circuit pattern; and an insulating layer formed between the heat radiating plate and the conductor pattern layer.

The heat radiating plate may include: a first heat radiating part having the control device mounted thereover; and a second heat radiating part formed integrally with the first heat radiating part at a side of the first heat radiating part, having a thickness thicker than that of the first heat radiating part, and having the power device mounted thereover.

The heat radiating plate may be made of a non-metal inorganic material of diamond or ceramic.

The heat radiating plate may be made of at least one selected from a group consisting of aluminum (Al), copper (Cu), molybdenum (Mo), tungsten (W), titanium (Ti), and magnesium (Mg).

The bottom of the heat radiating plate having a thin thickness at a region at which the step is formed may be filled with a heterogeneous material having thermal conductivity lower than that of the heat radiating plate.

The heterogeneous material may be an epoxy resin.

According to another preferred embodiment of the present invention, there is provided a method of manufacturing a heat radiating substrate, including: preparing a heat radiating base plate; forming a heat radiating plate by forming a step at the bottom of the heat radiating base plate so that one side and the other side of the heat radiating base plate have thicknesses different from each other; forming an insulating layer on the heat radiating plate; and forming a conductor pattern layer on the insulating layer, the conductor pattern layer including a mounting pad on which a control device and a power device are mounted and a circuit pattern.

In the preparing of the heat radiating base plate, the heat radiating base plate may be made of a non-metal inorganic material of diamond or ceramic.

In the preparing of the heat radiating base plate, the heat radiating base plate may be made of at least one selected from a group consisting of aluminum (Al), copper (Cu), molybdenum (Mo), tungsten (W), titanium (Ti), and magnesium (Mg).

In the forming of the heat radiating plate, the step may be formed by a drill process.

The method may further include, after the forming of the heat radiating plate, filling the bottom of the heat radiating plate having a thin thickness at a region at which the step is formed with a heterogeneous material having thermal conductivity lower than that of the heat radiating plate.

In the filling, the heterogeneous material may be an epoxy resin.

In the forming of the conductor pattern layer, the mounting pad on which the control device is mounted may be formed over a region having a thin thickness in the heat radiating plate.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
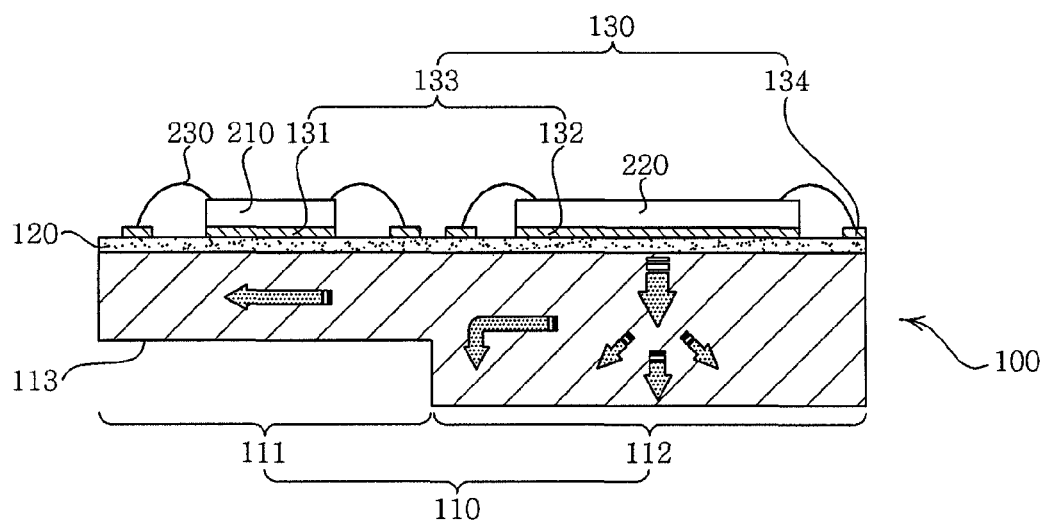
FIG. 1 is an illustrative view showing a side of a heat radiating substrate according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is an illustrative view showing a side of a heat radiating substrate according to a preferred embodiment of the present invention.

Referring to FIG. 1, the heat radiating substrate 100 may be configured to include a heat radiating plate 110, an insulating layer 120, and a conductor pattern layer 130.

The heat radiating plate 110 is a component radiating heat generated from a control device 210 or a power device 220 to the outside. The heat radiating plate 110 according to the preferred embodiment of the present invention may have a step 113 formed so that one side and the other side thereof have thicknesses different from each other. More specifically, the heat radiating plate 110 according to the preferred embodiment of the present invention may include a first heat radiating part 111 and a second heat radiating part 112.

The first heat radiating part 111 may have the control device 210 mounted thereover. In addition, the first heat radiating part 111 may have the step 113 formed at the bottom thereof. That is, the first heat radiating part 111 may have a thickness thinner than that of the second heat radiating part 112.

The second heat radiating part 112 may have the power device 220 mounted thereover. The second heat radiating part 112 may be formed at a side of the first heat radiating part 111. In addition, the second heat radiating part 112 may be formed integrally with the first heat radiating part 111. Although the case in which the second heat radiating part 112 is formed integrally with the first heat radiating part 111 at one side of the first heat radiating part 111 is shown in the preferred embodiment of the present invention, the present invention is not limited thereto. That is, the number and the position of second heat radiating parts 112 may be changed by those skilled in the art if necessary.

The heat radiating plate 110 may be made of a material having high thermal conductivity. For example, the heat radiating plate 110 may be made of at least one selected from a group consisting of aluminum (Al), copper (Cu), molybdenum (Mo), tungsten (W), titanium (Ti), and magnesium (Mg). Alternatively, the heat radiating plate 110 may be made of a non-metal inorganic material of diamond or ceramic.

The insulating layer 120 may be formed on the heat radiating plate 110. The insulating layer 120 may be formed in order to electrically insulate the heat radiating plate 110 and the conductor pattern layer 130 from each other. The insulating layer 120 may be formed on the entire upper surface of the heat radiating plate 110. Alternatively, the insulating layer 120 may be formed on the heat radiating plate 110 and be formed only beneath the conductor pattern layer 130. The insulating layer 120 may be made of an epoxy based organic insulating material. Alternatively, the insulating layer 120 may be formed of an anodized film. However, the insulating layer 120 is not limited to being made of the above-mentioned material, but may also be made of any known insulating material.

The conductor pattern layer 130 may be formed on the insulation layer 120. The conductor pattern layer 130 may have the control device 210 and the power device 220 directly mounted thereon. In addition, the conductor pattern layer 130 may be electrically connected to the control device 210 and the power device 220. The conductor pattern layer 130 may be made of an electrically conductive metal.

The conductor pattern layer 130 may include a mounting pad 133 and a circuit pattern 134. The mounting pad 133 is a component on which the control device 210 and the power device 220 are mounted. The mounting pad 133 may include a first mounting pad 131 and a second mounting pad 132. The first mounting pad 131 may have the control device 210 mounted thereon. The first mounting pad 131 may be formed over the first heat radiating part 111. The second mounting pad 132 may have the power device 220 mounted thereon. The second mounting pad 132 may be formed over the second heat radiating part 112. The circuit pattern 134 may be electrically connected to the power device 220 and the control device 210 by a wire 230 or a lead frame (not shown).

The heat radiating substrate 100 according to the preferred embodiment of the present invention is for a device package. Both of the power device 220 generating heat and the control device 210 having a lower operation temperature may be mounted on the heat radiating substrate 100 of the package. The heat radiating substrate 100 according to the preferred embodiment of the present invention may have the step 113 formed at a region at which the control device 210 is mounted. The heat generated from the power device 220 and conducted to the control device 210 through the heat radiating plate 110 may be decreased by the step 113 formed as described above. Therefore, the heat radiating substrate 100 according to the preferred embodiment of the present invention may protect the control device 210 from the heat generated from the power device 220. In addition, the heat radiating substrate 100 according to the preferred embodiment of the present invention protects the control device 210 from the heat generated from the power device 220, thereby making it possible to improve performance and reliability of the package.

Figure 2:
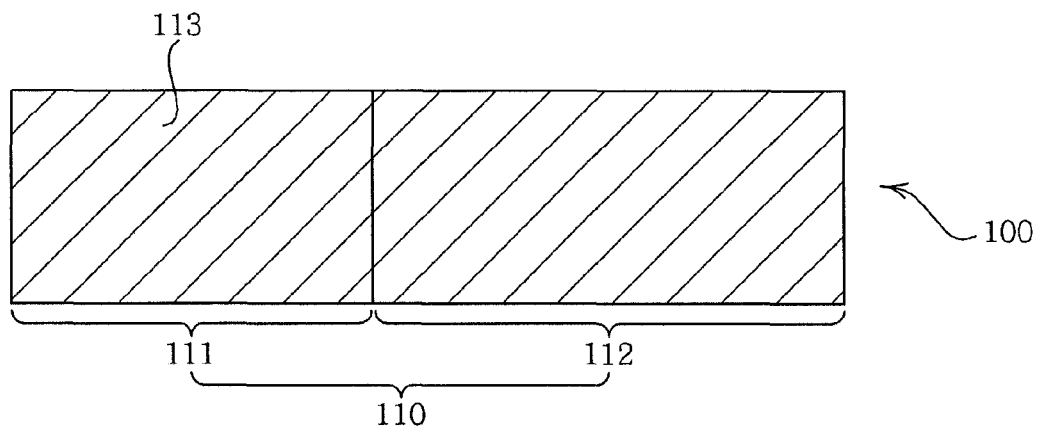
FIG. 2 is an illustrative view showing the bottom of the heat radiating substrate according to the preferred embodiment of the present invention.

FIG. 2 is an illustrative view showing the bottom of the heat radiating substrate according to the preferred embodiment of the present invention.

Referring to FIG. 2 the bottom of the heat radiating plate 110 among components configuring the heat radiating substrate 100 may be confirmed. According to the preferred embodiment of the present invention, the heat radiating plate 110 may have the step 113 formed at the bottom thereof.

Figure 3:
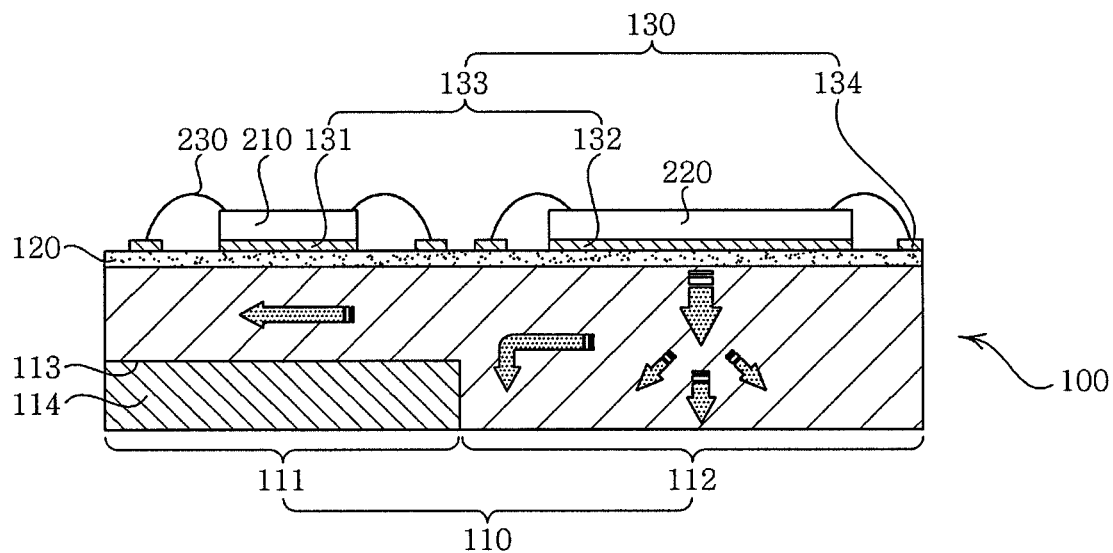
FIG. 3 is an illustrative view showing a side of a heat radiating substrate according to another preferred embodiment of the present invention.

FIG. 3 is an illustrative view showing a side of a heat radiating substrate according to another preferred embodiment of the present invention.

Referring to FIG. 3, the heat radiating substrate 100 may be configured to include a heat radiating plate 110, an insulating layer 120, and a conductor pattern layer 130.

The heat radiating plate 110 is a component radiating heat generated from a control device 210 or a power device 220 to the outside. The heat radiating plate 110 according to the preferred embodiment of the present invention may have a step 113 formed so that one side and the other side thereof have thicknesses different from each other. More specifically, the heat radiating plate 110 according to the preferred embodiment of the present invention may include a first heat radiating part 111 and a second heat radiating part 112.

The first heat radiating part 111 may have the control device 210 mounted thereover. In addition, the first heat radiating part 111 may have the step 113 formed at the bottom thereof. That is, the first heat radiating part 111 may have a thickness thinner than that of the second heat radiating part 112.

According to another preferred embodiment of the present invention, an inner portion of the step 113 may be filled with a heterogeneous material 114, which is a material different from that of the heat radiating plate 110. The inner portion of the step 113 may become the bottom of the first heating part 111. Here, the heterogeneous material 114 may be a material having thermal conductivity lower than that of the heat radiating plate 110. For example, the heterogeneous material 114 may be an epoxy resin. The heat generated from the power device 220 and conducted to the control device 210 through the heat radiating plate 110 may be decreased by the heterogeneous material 114 filled in the step 113 as described above. In addition, the heterogeneous material 114 is filled in the step 113 to complement a structural problem that may occur by forming the step 113, thereby making it possible to improve reliability.

The second heat radiating part 112 may have the power device 220 mounted thereover. The second heat radiating part 112 may be formed at a side of the first heat radiating part 111. In addition, the second heat radiating part 112 may be formed integrally with the first heat radiating part 111. Although the case in which the second heat radiating part 112 is formed integrally with the first heat radiating part 111 at one side of the first heat radiating part 111 is shown in the preferred embodiment of the present invention, the present invention is not limited thereto. That is, the number and the position of second heat radiating parts 112 may be changed by those skilled in the art if necessary. Since the power device 220 having a high heat generation amount is mounted over the second heat radiating part 112, thermal conductivity of the second heat radiating part 112 needs to be increased. Therefore, the second heat radiating part 112 may be made of only a metal having high thermal conductivity.

The heat radiating plate 110 may be made of a material having high thermal conductivity. For example, the heat radiating plate 110 may be made of at least one selected from a group consisting of aluminum (Al), copper (Cu), molybdenum (Mo), tungsten (W), titanium (Ti), and magnesium (Mg). Alternatively, the heat radiating plate 110 may be made of a non-metal inorganic material of diamond or ceramic.

The insulating layer 120 may be formed on the heat radiating plate 110. The insulating layer 120 may be formed in order to electrically insulate the heat radiating plate 110 and the conductor pattern layer 130 from each other. The insulating layer 120 may be formed on the entire upper surface of the heat radiating plate 110. Alternatively, the insulating layer 120 may be formed on the heat radiating plate 110 and be formed only beneath the conductor pattern layer 130. The insulating layer 120 may be made of an epoxy based organic insulating material. Alternatively, the insulating layer 120 may be formed of an anodized film. However, the insulating layer 120 is not limited to being made of the above-mentioned material, but may also be made of any known insulating material.

The conductor pattern layer 130 may be formed on the insulation layer 120. The conductor pattern layer 130 may have the control device 210 and the power device 220 directly mounted thereon. In addition, the conductor pattern layer 130 may be electrically connected to the control device 210 and the power device 220. The conductor pattern layer 130 may be made of an electrically conductive metal.

The conductor pattern layer 130 may include a mounting pad 133 and a circuit pattern 134. The mounting pad 133 is a component on which the control device 210 and the power device 220 are mounted. The mounting pad 133 may include a first mounting pad 131 and a second mounting pad 132. The first mounting pad 131 may have the control device 210 mounted thereon. The first mounting pad 131 may be formed over the first heat radiating part 111. The second mounting pad 132 may have the power device 220 mounted thereon. The second mounting pad 132 may be formed over the second heat radiating part 112. The circuit pattern 134 may be electrically connected to the power device 220 and the control device 210 by a wire 230 or a lead frame (not shown).

The heat radiating substrate 100 according to the preferred embodiment of the present invention may have the step 113 formed at a region at which the control device 210 is mounted. Here, the step 113 may have the heterogeneous material 114 present therein, wherein the heterogeneous material 114 has thermal conductivity lower than that of the heat radiating plate 110. That is, the heat generated from the power device 220 and conducted to the control device 210 through the heat radiating plate 110 may be decreased by the heterogeneous material 114 having the thermal conductivity lower than that of the heat radiating plate 110.

Figure 4:
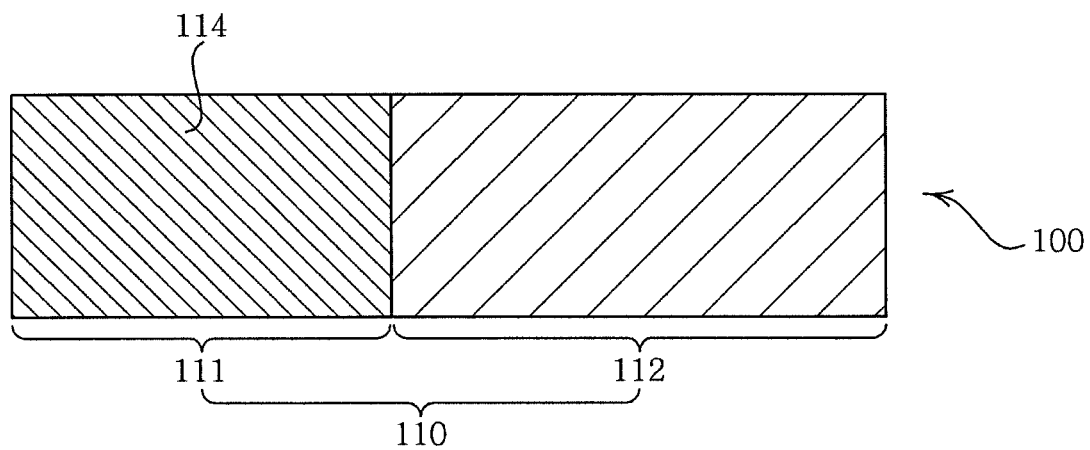
FIG. 4 is an illustrative view showing the bottom of the heat radiating substrate according to another preferred embodiment of the present invention.

FIG. 4 is an illustrative view showing the bottom of the heat radiating substrate according to another preferred embodiment of the present invention Referring to FIG. 4 the bottom of the heat radiating plate 110 among components configuring the heat radiating substrate 100 may be confirmed. According to the preferred embodiment of the present invention, the heat radiating plate 110 may have the step 113 (See FIG. 3) formed at the bottom thereof. In addition, the step 113 (See FIG. 3) may have the heterogeneous material 114 formed therein. Here, the heterogeneous material 114 may be a material having thermal conductivity lower than that of the heat radiating plate 110. For example, the heterogeneous material 114 may be an epoxy resin.

FIGS. 5 to 9 are illustrative views showing a method of manufacturing a heat radiating substrate according to the preferred embodiment of the present invention.

Figure 5:
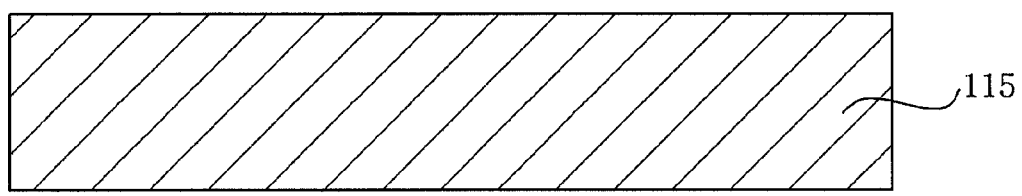
FIGS. 5 to 9 are illustrative views showing a method of manufacturing a heat radiating substrate according to the preferred embodiment of the present invention.

Referring to FIG. 5, a heat radiating base plate 115 may be prepared. The heat radiating base plate 115 may be made of a material having high thermal conductivity. For example, the heat radiating base plate 115 may be made of at least one selected from a group consisting of aluminum (Al), copper (Cu), molybdenum (Mo), tungsten (W), titanium (Ti), and magnesium (Mg). Alternatively, the heat radiating base radiating plate 115 may be made of a non-metal inorganic material of diamond or ceramic.

Figure 6:
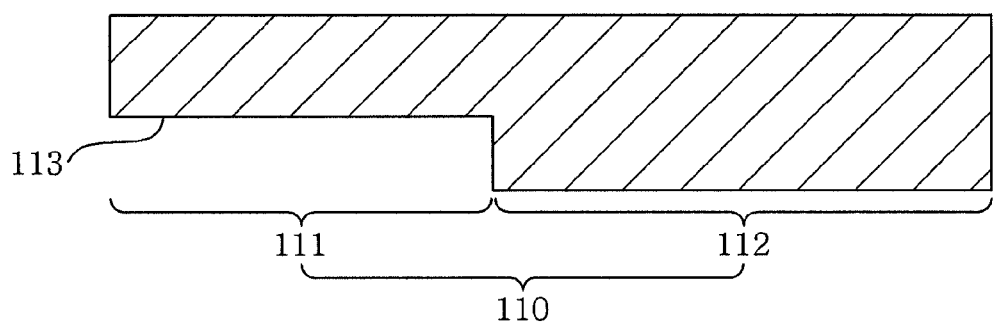

Referring to FIG. 6, the step 113 may be formed in the heat radiating base plate 115. The step 113 may be formed at the bottom of the first heating part 111. Here, the first heat radiating part 111 may be one side region of the heat radiating base plate 115 at which a control device 210 (See FIG. 9) is subsequently to be mounted. That is, the heat radiating base plate 115 may be processed to have a thickness thinner at the bottom of one side thereof than at the other side thereof. The step 113 may be formed by a drill process.

As described above, the step 113 is formed at the bottom of one side of the heat radiating base plate 115, such that the heat radiating plate 110 having a structure in which thicknesses of one side and the other side thereof are different from each other may be formed. The heat radiating plate 110 according to the preferred embodiment of the present invention may be divided into the first heat radiating part 111 over which a control device 210 (See FIG. 9) is subsequently mounted and the second heat radiating part 112 over which a power device 220 (See FIG. 9) is subsequently mounted.

Figure 7:
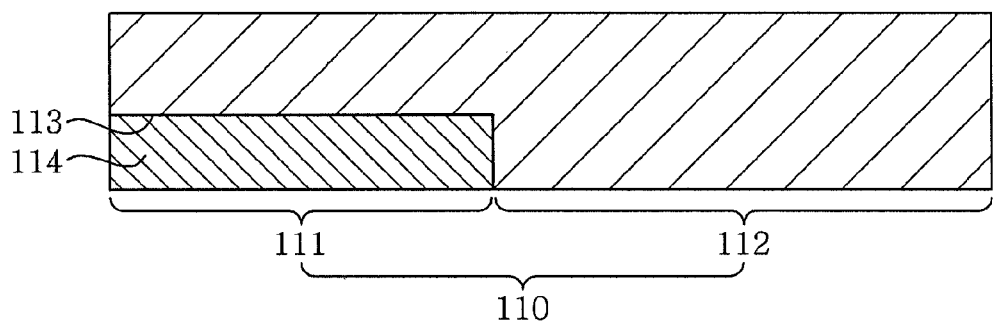

Referring to FIG. 7, the heterogeneous material 114 may be filled in the step 113 of the heat radiating plate 110. Here, the heterogeneous material 114 may be a material having thermal conductivity lower than that of the heat radiating plate 110. For example, the heterogeneous material 114 may be an epoxy resin. The heat generated from the power device 220 and conducted to the control device 210 through the heat radiating plate 110 may be decreased by the heterogeneous material 114 filled in the step 113 as described above. In addition, the heterogeneous material 114 is filled in the step 113 to complement a structural problem that may occur by forming the step 113, thereby making it possible to improve reliability.

Figure 8:
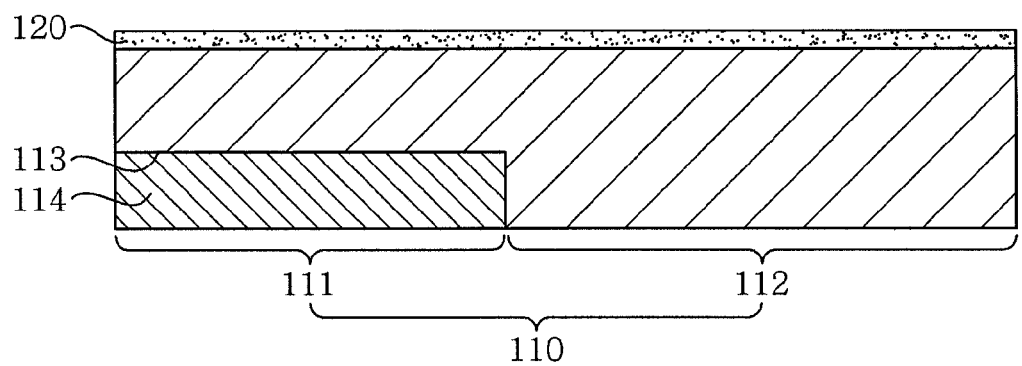

Referring to FIG. 8, the insulation layer 120 may be formed on the heating radiating plate 110. The insulating layer 120 may be formed on the entire upper surface of the heat radiating plate 110. Alternatively, the insulating layer 120 may be formed on the heat radiating plate 110 and be formed only beneath the conductor pattern layer 130. Here, the insulating layer 120 may be formed on the entire upper surface of the heat radiating plate 110 and be then patterned so as to be formed beneath the conductor pattern layer 130. As a method of forming the insulating layer 120, a known method may be used. The insulating layer 120 may be made of an epoxy based organic insulating material. Alternatively, the insulating layer 120 may be formed of an anodized film. However, the insulating layer 120 is not limited to being made of the above-mentioned material, but may also be made of any known insulating material.

Figure 9:
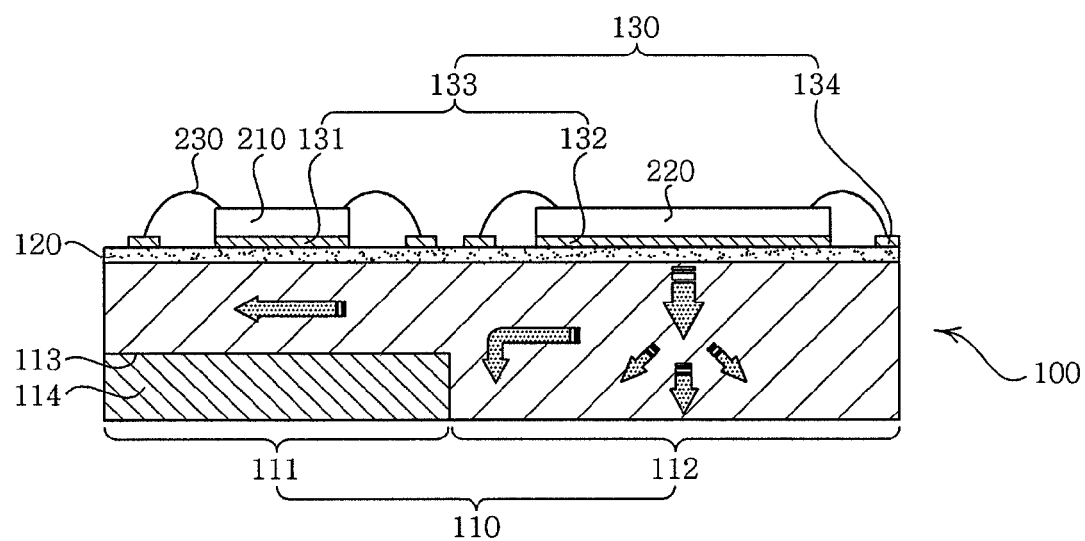

Referring to FIG. 9, the conductor pattern layer 130 may be formed on the insulation layer 120. The conductor pattern layer 130 may include a mounting pad 133 and a circuit pattern 134. Here, the mounting pad 133 may include a first mounting pad 131 and a second mounting pad 132. The first mounting pad 131 may have the control device 210 mounted thereon. The first mounting pad 131 may be formed over the first heat radiating part 111. The second mounting pad 132 may have the power device 220 mounted thereon. The second mounting pad 132 may be formed over the second heat radiating part 112. The circuit pattern 134 may be electrically connected to the power device 220 and the control device 210 by a wire 230 or a lead frame (not shown).

The conductor pattern layer 130 may be made of an electrically conductive metal. A kind of metal configuring the connector pattern layer 130 is not particularly limited as long as it has electrical conductivity, but may be generally copper, a copper alloy, or the like. A method of forming the conductor pattern layer 130 is not particularly limited, but may be performed by a known technology. The conductor pattern layer 130 may be formed by an electroless plating method and an electroplating method.

The method of manufacturing a heat radiating substrate according to the preferred embodiment of the present invention includes filling the step 113 of the heat radiating plate 110 with the heterogeneous material 114, but is not limited thereto. The heterogeneous material 114 is a material having thermal conductivity lower than that of the heat radiating plate 110 and is to suppress the heat generated from the power device 220 from being conducted to the control device 210 through the heat radiating plate 110. In the case in which the heat radiating plate 110 has thermal conductivity higher than that of air, the filling of the heterogeneous material 114 in the step 113 may be omitted. That is, air present in the step 113 has thermal conductivity lower than the heat radiating plate 110, such that it may serve to prevent the heat generated from the power device 220 from being conducted to the control device 210. Therefore, the filling of the heterogeneous material 114 in the step 113 of the heat radiating plate 110 may be easily omitted or added by those skilled in the art.

With the heat radiating substrate and the method of manufacturing the same according to the preferred embodiment of the present invention, the heat generated from the power device and conducted to the control device may be decreased by the step structure of the heat radiating substrate formed under the control device. Therefore, a defect of the control device due to the heat generated from the power device may be prevented.

In addition, with the heat radiating substrate and the method of manufacturing the same according to the preferred embodiment of the present invention, the heat generated from the power device and conducted to the control device is decreased, thereby making it possible to improve performance and reliability of a package at the time of packaging the devices.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A heat radiating substrate comprising:
   a heat radiating plate having a step in one side formed so that one side and the other side thereof have thicknesses different from each other;
   a conductor pattern layer formed on an opposite surface of a surface with the step in the heat radiating plate and including a first mounting pad on which a control device is mounted, a second mounting pad on which a power device is mounted, and a circuit pattern; and
   an insulating layer formed between the opposite surface of the surface with the step in the heat radiating plate and the conductor pattern layer,
   wherein the opposite surface of the surface with the step in the heat radiating plate is substantially flat,
   wherein the heat radiating plate includes:
      a first heat radiating part having the first mounting pad on which the control device is mounted; and
      a second heat radiating part formed integrally with the first heat radiating part at a side of the first heat radiating part, having a thickness thicker than that of the first heat radiating part, and having the second mounting pad on which the power device is mounted, wherein the first heat radiating part or the second heat radiating part has a step, and wherein the bottom of the heat radiating plate having a thin thickness at a region at which the step is formed is filled with a heterogeneous material having thermal conductivity lower than that of the heat radiating plate.

2. The heat radiating substrate as set forth in claim 1, wherein the heat radiating plate is made of a non-metal inorganic material of diamond or ceramic.

3. The heat radiating substrate as set forth in claim 1, wherein the heat radiating plate is made of at least one selected from a group consisting of aluminum (Al), copper (Cu), molybdenum (Mo), tungsten (W), titanium (Ti), and magnesium (Mg).

4. The heat radiating substrate as set forth in claim 1, wherein the heterogeneous material is an epoxy resin.

5. A method of manufacturing a heat radiating substrate, comprising:

preparing a heat radiating base plate;

forming a heat radiating plate by forming a step at the bottom of the heat radiating base plate so that one side and another side of the heat radiating base plate have thicknesses different from each other;

forming an insulating layer on an upper part, which is an opposite surface of a surface with the step in the heat radiating plate;

forming a conductor pattern layer on the insulating layer, the conductor pattern layer including a first mounting pad on which a control device is mounted, a second mounting pad on which a power device is mounted, and a circuit pattern; and mounting the control device on the first mounting pad and mounting the power device on the second mounting pad, wherein the heat radiating plate includes:

a first heat radiating part having the first mounting pad on which the control device is mounted; and a second heat radiating part formed integrally with the first heat radiating part at a side of the first heat radiating part, having a thickness thicker than that of the first heat radiating part, and having the second mounting pad on which the power device is mounted, wherein the first heat radiating part or the second heat radiating part has a step, and the method, further comprising:

after the forming of the heat radiating plate, filling the bottom of the heat radiating plate having a thin thickness at a region at which the step is formed with a heterogeneous material having thermal conductivity lower than that of the heat radiating plate.

6. The method as set forth in claim 5, wherein in the preparing of the heat radiating base plate, the heat radiating base plate is made of a non-metal inorganic material of diamond or ceramic.

7. The method as set forth in claim 5, wherein in the preparing of the heat radiating base plate, the heat radiating base plate is made of at least one selected from a group consisting of aluminum (Al), copper (Cu), molybdenum (Mo), tungsten (W), titanium (Ti), and magnesium (Mg).

8. The method as set forth in claim 5, wherein in the forming of the heat radiating plate, the step is formed by a drill process.

9. The method as set forth in claim 5, wherein in the filling, the heterogeneous material is an epoxy resin.

10. The method as set forth in claim 5, wherein in the forming of the conductor pattern layer, the first mounting pad on which the control device is mounted is formed over a region having a thin thickness in the heat radiating plate.

11. The heat radiating substrate as set forth in claim 1, wherein the control device directly contacts with the insulating layer.

12. The method as set forth in claim 5, wherein in the forming of the conductor pattern layer, the first mounting pad mounting the control device directly contacts with the insulating layer.

* * * * *